United States Patent [19]
Angelopoulos et al.

[11] Patent Number: 6,103,145
[45] Date of Patent: *Aug. 15, 2000

[54] CROSSLINKED WATER-SOLUBLE ELECTRICALLY CONDUCTING POLYMERS

[75] Inventors: Marie Angelopoulos, Briarcliff Manor, N.Y.; Jeffrey Donald Gelorme, Plainville, Conn.; Thomas Harold Newman, Mount Kisco, N.Y.; Niranjan Mohanlal Patel, Wappingers Falls, N.Y.; David Earle Seeger, Congers, N.Y.

[73] Assignee: International Business Machines Corporation, Armonk, N.Y.

[*] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 08/478,468

[22] Filed: Jun. 7, 1995

Related U.S. Application Data

[62] Division of application No. 08/306,654, Sep. 15, 1994, which is a division of application No. 08/025,490, Mar. 3, 1993, Pat. No. 5,370,825.

[51] Int. Cl.$^7$ ........................................ H01B 1/12
[52] U.S. Cl. ........................ 252/500; 528/210; 528/422
[58] Field of Search ...................... 252/500; 528/422, 528/423, 424, 210, 212, 214

[56] References Cited

U.S. PATENT DOCUMENTS

| | | | |
|---|---|---|---|
| Re. 33,223 | 5/1990 | Jonas et al. ........................... | 252/518 |
| 3,346,444 | 10/1967 | Lupinski et al. ...................... | 161/213 |
| 3,674,711 | 7/1972 | Growald et al. ...................... | 252/500 |
| 3,814,703 | 6/1974 | Nakayama et al. .................... | 252/500 |
| 3,828,008 | 8/1974 | Shinohara et al. .................... | 260/78.4 |
| 3,835,102 | 9/1974 | Shinohara et al. .................... | 260/78.4 |
| 3,862,094 | 1/1975 | Shinohara et al. .................... | 252/500 |
| 4,222,903 | 9/1980 | Heeger et al. ......................... | 252/518 |
| 4,375,427 | 3/1983 | Miller et al. .......................... | 252/512 |
| 4,554,093 | 11/1985 | Aldissi ................................. | 52/500 |
| 4,729,851 | 3/1988 | Braunling et al. .................... | 252/500 |
| 4,731,408 | 3/1988 | Jasne .................................... | 252/511 |
| 4,834,911 | 5/1989 | Carew ................................... | 252/500 |
| 4,880,508 | 11/1989 | Aldissi ................................. | 252/500 |
| 4,929,389 | 5/1990 | Aldissi ................................. | 252/500 |
| 4,952,667 | 8/1990 | Shikatani et al. ..................... | 528/230 |
| 5,068,060 | 11/1991 | Jen et al. .............................. | 252/500 |
| 5,147,913 | 9/1992 | MacDiarmid et al. ................ | 524/104 |
| 5,205,965 | 4/1993 | Uetani et al. ......................... | 252/500 |
| 5,489,400 | 2/1996 | Liu et al. .............................. | 252/500 |

FOREIGN PATENT DOCUMENTS

| | | |
|---|---|---|
| 63-215722 | 8/1988 | Japan . |
| 2-69525 | 8/1990 | Japan . |
| 5-262981 | 12/1993 | Japan . |
| 2124635 | 2/1984 | United Kingdom . |

OTHER PUBLICATIONS

Liu et al "Novel Template Guided Synthesis of Polyaniline" Mat. Res. Soc. Symp. Proc. vol. 247, Jan. 1992, pp601–606.

A.G. MacDiarmid et al., "Polyaniline: A New Concept in Conducting Polymers", *Synthetic Metals*, vol. 18, pp. 285–290 (1987).

Suzhen Li et al., "Soluble Polyaniline", *Synthetic Metals*, vol. 20, pp. 141–149 (1987).

Jia–Ming Liu et al., "Novel Template Guided Synthesis of Polyaniline", *Mat. Res. Soc. Symp. Proc.*, vol. 247, pp. 601–606 (1992).

*Primary Examiner*—Mark Kopec
*Attorney, Agent, or Firm*—Daniel P. Morris

[57] ABSTRACT

Disclosed is a novel composition of matter comprising a polyacid and a polymer containing repeating units which contain one or more basic atoms. The complex is water-soluble and electrically conductive. The complex is useful in providing organic discharge layers for use in electronic applications and fabrications.

19 Claims, No Drawings

CROSSLINKED WATER-SOLUBLE ELECTRICALLY CONDUCTING POLYMERS

This is a divisional of copending application Ser. No. 08/306,654, filed on Sep. 15, 1994, which is a divisional of U.S. Ser. No. 08/025,490, filed on Mar. 3, 1993, now U.S. Pat. No. 5,370,825.

BACKGROUND OF THE INVENTION

The present invention relates to novel electrically conductive polymer complexes, electrically conductive resists, uses thereof and structures fabricated therewith. More particularly, this invention relates to water-soluble, electrically conductive substituted and unsubstituted polymer complexes and their use as, inter alia, electrical discharge layers, resists, discharge layers for electron-beam lithography and SEM (scanning electron microscope) inspection, and as coatings (especially radiation-curable coatings), for electrostatic charge (ESC) and electrostatic discharge (ESD) applications.

In electron-beam lithography using organic resists, which are insulators, there can arise an accumulation of charge during the writing process due to the absence of an adequate conducting path for immediate bleed-off of the electrons. This charging can result in beam pattern displacement deflection, loss of accuracy in pattern-to-pattern-overlay, or in extreme cases a catastrophic discharge of voltage.

Traditionally, suggestions to circumvent this problem have included the use of a discharge layer in the form of a conductor below or above the resist coating. The layer could be in the form of thin evaporated or spattered metal coatings, indium-tin oxide films, or amorphous carbon films produced by chemical vapor deposition processes. Although effective in some contexts, these methods are not universally ideal since the processes involved in their utilization tend to influence negatively the performance of the resist, and in some cases are difficult to remove.

It is also useful to provide materials that can alleviate electrostatic charging (that is, the unwanted accumulation of static electricity which becomes capable of attracting unwanted airborne particles to e.g. cathode ray tube screens and electronic component carriers), and alleviate electrostatic discharge, in which static electricity is suddenly released in a discharge that can distort the performance of electronic devices and even damage or destroy electronic components. A material that can facilitate the application and creation of such materials would be useful.

While polyaniline as described in the literature might be considered a promising candidate to use to solve these needs, the practical use of currently available polyaniline-based systems has been limited due to the fact that solvents such as N-methyl pyrrolidinone are needed for the application and removal. These solvents are known to interfere with some substrate chemistries. In addition, they create interfacial problems and can tend to dissolve certain substrates. Still other selective polyaniline-derived systems are soluble in more benign organic solvents; however, they are known to be difficult to remove once applied. It is also useful to form a conducting resist which provides patterns of conductive lines on a substrate. The steps involved in forming such lines can include depositing a layer, exposing selected portions of the layer to a given radiation (e.g., ultraviolet or visible light, electron beam, X-ray, or ion beam) to create a solubility difference between exposed and unexposed portions, and then removing the more soluble portions so that only the desired pattern remains. This type of technique is often frustrated by the difficulty of removing the unwanted material after it is developed.

The problem of charging in electron-beam methods arise because the resists are insulators. With a conducting resist, which is one aspect of the present invention, charging should not occur and a separate discharge layer should not be needed.

Thus, there remains a need for a polymeric material which can be used in the applications described herein, and which is easily applicable; is chemically inert with respect to the systems with which it is used; is environmentally benign, particularly in not requiring the use of organic solvents which would volatilize into the atmosphere; and which is removable when desired with minimal effort, with minimal harm to the substrate itself.

DESCRIPTION OF PRIOR ART

The preparation of polyaniline systems is described in Li et al., "Soluble Polyaniline" in *Synthetic Metals*, 20 (1987), at pages 141–149. That article discloses that, even when the polymerization of the aniline is carried out in the presence of the polyacid polystyrene sulfonic acid (PSSA), the polymerization results in a precipitate from the aqueous solution in which the aniline polymerization proceeds.

MacDiarmid et al., in "Polyaniline: A New Concept in Conducting Polymers", *Synthetic Metals*, 18 (1987), at pages 285–290, describe polyaniline and its protonated form, and indicate that the material is electrically conductive.

U.S. Pat. No. 5,068,060 relates to the synthesis of poly (heterocyclic vinylenes) as electrically conductive materials. According to the disclosure, the backbone of the polymer is altered to impart desired properties, and solubility is exhibited only in an undoped precursor form. U.S. Pat. No. 4,929,389 and U.S. Pat. No. 4,880,508 relate to the synthesis of water soluble conductive polymers, in which the moiety responsible for water solubility is incorporated into the backbone of the polymer. By contrast, in the present invention the final product exhibits both water solubility and electrical conductivity, and does so without requiring alteration of the polymer backbone.

U.S. Pat. No. 4,375,427 relates to the synthesis of thermoplastic-type polymers that can be doped to be made conductive. However, the disclosed materials are not water soluble, and are synthesized by condensation reactions rather than oxidation reactions.

BRIEF SUMMARY OF THE INVENTION

One aspect of the present invention resides in a water-soluble electrically conductive composition of matter comprising a polyacid, and a polymer comprising at least one conjugated region composed of repeating units incorporating a conjugated basic atom. A preferred example of such a repeating monomeric unit is aniline or a substituted aniline, which incorporates a nitrogen atom in that the nitrogen can participate in the conjugation in the polymer.

Another aspect of the present invention comprises solutions, in particular aqueous solutions, of such compositions of matter.

Another aspect of the present invention comprises a process for forming a water-soluble, electrically conductive composition of matter comprising a polyacid and a polymer, such as polyaniline, comprising at least one conjugated region composed of monomeric units incorporating a conjugated basic atom. The process comprises forming a solution of said polyacid and the corresponding monomer, wherein the number of acid groups in the polyacid exceeds the number of protonatable basic atoms in the polymer to be formed (it being understood that the polymer will include basic atoms that are not protonatable), and polymerizing the monomer while controlling the rate of initiation and the rate of propagation of said polymerization such that the polymerization forms said water-soluble composition of matter.

Further aspects of the invention includes compositions of matter which are water-soluble and electrically conductive as described herein and which are cross-linkable upon exposure to electromagnetic radiation to form water-insoluble conductive products; structures having such a composition of matter disposed thereon; processes of using such compositions of matter to make electrically conductive layers and films; and the products formed by such cross-linking, such as conducting resists.

Yet another aspect of the present invention is a structure, comprising a substrate on which is disposed said water-soluble electrically conductive composition of matter. Such structures include dielectric materials; said composition of matter is useful as a conductive electron beam resist, optical resist, X-ray resist, and electrostatic discharge layer.

A further aspect of the present invention comprises a method of disposing said water-soluble, electrically conductive composition of matter on a surface as e.g. a conductive resist or an electrostatic discharge layer.

DETAILED DESCRIPTION OF THE INVENTION

Without being bound by any particular theory of the present invention, the observed behavior of the composition of matter which is one aspect of the present invention is consistent with the belief that the polyacid and the polymer which comprise the composition of matter are in mutual association with each other. The association is believed to be more ionic in character than covalent. Thus, while the composition of matter is described herein as comprising polyacid and polymer, as described, it will be recognized that in situ the composition of matter can also be understood as comprising the polymer in which basic atoms, or even all basic atoms, are protonated by hydrogen ions from the acidic groups of the polyacid. However, it will be understood that the precise nature of the association is not controlling.

Different regions of a given polyacid molecule may be associated with basic atoms on distinct polymer molecules, without departing from the invention whose noteworthy aspects include the water solubility and electrical conductivity of the composition of matter.

The polyacid component of the present invention can, in its broadest aspect, comprise any organic polymer at least some, or all, of whose repeating units include an acidic moiety. The acidic moiety can be carboxylic, i.e. —COOH, or can be another group such as a phosphonic acid group, a phosphoric acid group, a boric acid group (i.e. —BO$_2$H), a sulfuric acid group, or a sulfonic acid group. The acidic group can be pendant directly from the polymer backbone, or can be a substituent on another group which is itself pendant from the polymer backbone.

The preferred polyacids suitable for use in the present invention are water-soluble at the concentrations described herein in which the preparation of the complex of the present invention is carried out.

Preferred polyacids have polymer backbones which are vinylic, that is, composed of repeating units of the generalized formula —(CH$_2$CHX)—, wherein X is an acid group or is a substituent which is substituted with an acid group.

Preferred examples of polyacids include poly(styrene sulfonic acid), poly(acrylic acid), poly(methacrylic acid), poly(vinyl sulfonic acid), poly(vinyl sulfuric acid), poly (vinyl boric acid), poly(styrene boric acid), poly(vinyl phosphoric acid), and polystyrene phosphoric acid). The preferred polyacid is polystyrene sulfonic acid), referred to at points herein as PSSA.

It should also be recognized that polyacids suitable for the practice of the present invention may comprise copolymers some repeating units of which contain pendant acidic groups as described hereinabove and other repeating units of which do not, provided that such copolymeric polyacids exhibit the desired solubility in water. Such copolymers can be block copolymers, or copolymers in which acidic and non-acidic monomeric units are interspersed.

The polymer component of the compositions of matter of the present invention comprises one or more conjugated regions composed of monomeric units incorporating a conjugated basic atom. By "basic atom" is meant an atom that can form the positive part of an ionic couple by electron donation with the anionic moiety of the deprotonated acid group of the polyacid. The preferred basic atom is nitrogen. Other basic atoms include sulfur. The polymer is preferably of the type which can be prepared by oxidation-type polymerization as distinguished from condensation polymerization.

The polymer is characterized in that at least one region thereof is conjugated as a whole and is composed of monomeric units each of which incorporates a basic atom which is conjugated. Referring for simplicity to the well-known means of depicting the structure of a molecule using conventional atomic symbols and single and double bonds, by "conjugated" is meant as to a region that the structure of the region can be depicted in that means in more than one way (the actual structure in situ representing an average of all such depictions), and as to an atom that there is more than one way to depict the bonds connecting that atom to adjacent atoms. It is preferred, though not necessary, to extend the conjugation over the full extent of the polymer molecule. In the conjugated system an electron is essentially delocalized over the entire region of conjugated bonds. These electrons are more loosely bound and are available for electrical conduction. It is only necessary to sufficiently extend the conjugated region of an individual polymer molecule so that when the conjugated region of an individual molecule is adjacent to a part of the conjugated region of an adjacent molecule, and an electric field is applied, an electron can flow along an individual molecule and hop from one molecule to an adjacent molecule in a region where the conjugated regions of the adjacent molecules overlap.

Examples of polymers incorporating the foregoing characteristics include polymers containing conjugated regions, or composed entirely, of repeating units which are substituted or unsubstituted aniline, thiophene, pyrrole, and/or phenyl mercaptan (C$_6$H$_5$SH). Preferred examples of these include polyaniline, polythiophene, polypyrrole, poly(p-phenylene sulfide), and copolymers of these polymers. Polymers useful in the present invention also include polymers of any of the corresponding monomers which are ring-substituted with one or more straight or branched alkyl, alkoxy, or alkoxyalkyl groups, which can contain from 1 up to about 30 carbon atoms and preferably 1 to 6 carbon atoms, particularly where such substituents are cross-linkable with each other as described in more detail hereinbelow. It will also be recognized that polymers incorporated within the compositions of matter of the present invention may also be copolymers of any one or more of such monomers with other comonomers having ethylenic unsaturation, including but not limited to ethylene, propylene, vinyl chloride, styrene, vinyl alcohol, vinyl acetate. In such cases, as described above, the conjugated region or regions containing the basic monomeric units should comprise a block sufficiently long as to render the composition of matter conductive.

The preferred polymers within the compositions of matter of the present invention are polyaniline, poly(alkoxyalkyl aniline), poly(alkoxyaniline), and poly(alkylaniline) wherein the alkoxy and alkyl groups contain 1 to 6 carbon atoms and more preferably about 2 carbon atoms.

The compositions of matter of the present invention are uniquely characterized in that they exhibit solubility in water, and form in polar solvents solutions that remain stable even over protracted periods of time. These compositions of matter are also recoverable from such solutions as solids, which are conductive and which can be redissolved into water. In addition, the compositions of matter of the present invention exhibit significant electrical conductivity in the solid state as well as in solution in polar solvents.

The molecular weight of the compositions of matter of the present invention can be virtually any that the practitioner may desire, depending on the desired application. Thus, the compositions of matter may have a molecular weight on the order of 1,000 to a molecular weight on the order of 100,000, but more preferably on the order of 10,000 to 25,000, e.g. about 20,000.

The preparation of the compositions of matter in accordance with the present invention calls for polyacid, the desired monomer (or comonomers), a suitable solvent, and an effective amount of an initiator for the desired polymerization of the monomer(s).

The polyacid can be any polyacid meeting the characteristics described above. The monomer is selected with regard to the desired final polymer; in the preferred embodiment, the polyacid is PSSA and the monomer is aniline. For applications intended to produce a cross-linked product, the preferred monomers are o-ethylaniline or o-ethoxyaniline.

The solvent is a polar liquid in which the polyacid, monomer and final complex are soluble. Water is the preferred solvent; the solvent may also be an alkanol or a water/alkanol mixture.

The initiator is any material capable of initiating the oxidation polymerization of the monomer(s) present. The preferred initiator is ammonium persulfate, particularly when the monomer to be polymerized is an aniline. Other useful initiators include hydrogen peroxide, AIBN, iron trichloride, potassium permanganate, and others which will be readily apparent to those of ordinary skill in this art.

The amounts of polyacid and monomer need to be selected such that the number of acidic groups in the polyacid present in the reaction mixture exceeds the number of the basic atoms present in the quantity of monomer provided to the reaction mixture. Preferably, the final composition of matter that is obtained will have an excess of acidic moieties not associated with basic atoms in the polymer, thereby contributing to the water solubility of the composition of matter. Thus, it will be understood that as the ratio of acidic groups in the polyacid to basic atoms in the monomer reaction mixture increases, the water solubility of the composition of matter also increases. It is permissible that some of the acidic moieties on the polyacid are converted to salts with a cation (such as an alkali metal or ammonium), before or after the polymerization, so long as sufficient acidic moieties are present that protonate the protonatable basic atoms of the polymer so as to provide the desired solubility and conductivity.

It has been discovered that if the polymerization of the monomer or monomers in the presence of the polyacid is carried out under carefully controlled conditions, the desired water-soluble, electrically conductive composition of matter is formed and remains in solution until removal thereof from solution is desired. The practitioner will readily be able to confirm that the composition of matter of the present invention has been formed because the product of the polymerization described herein is a stable solution. By contrast, polymerizations that fail to produce the desired water-soluble composition of matter are readily distinguished by the formation of a precipitate or an insoluble gel (which is the result reported in the literature upon previous attempts at polymerization of such monomers in the presence of acids such as PSSA).

In general, the careful control of the polymerization is characterized by control of the rate of initiation of the polymerization, and of the rate of propagation of the polymer. This control can be provided, in turn, by controlling the temperature and adjusting the concentration of the polyacid, the monomer, and the initiator to levels below those levels at which the polymerization forms a precipitate. As indicated the practitioner will readily be able to determine for any particular combination of polyacid, monomer and initiator those concentrations thereof at which the polymerization will lead to the desired formation of the water-soluble, electrically conductive composition of matter in accordance with the present invention. The examples which follow will provide further guidance to the practitioner as to those concentration conditions which permit formation of the desired water-soluble electrically conductive composition of matter. The polymerization proceeds effectively at room temperature (25–30° C.). The temperature should not exceed about 30° C. because gelation can occur due to overly rapid reaction. Thus, lower reaction temperatures are preferred as they permit greater regulation of the polymerization and enhance water solubility of the resultant product.

The polymerization is allowed to proceed to completion, following which the compositions can be recovered from solution when desired by precipitation (for instance by adding acetone to the aqueous product solution). It is preferred then to wash the product to removal oligomeric species and any unconsumed initiator, whereupon the compositions of matter is filtered and then dried. The resulting powder is readily resoluble in water, preferably deionized water. Typically, 5–10 wt. % solutions are effective to permit preparation of spin-coated thin films.

The invention and its utilization will be illustrated further in the following examples, which are to be construed as illustrative and non-limiting.

EXAMPLE 1

Polymerization reactions were carried out in aqueous solutions containing PSSA, aniline, and ammonium persulfate as the oxidizer/initiator. In one set of experiments, the molarity of the PSSA was changed while the ratio of PSSA to aniline, and the ratio of initiator to aniline, were held constant. The results, set forth in Table 1 below, showed that when the PSSA concentration was greater than 0.25 M, the polymerization led to a gelled material which was not the desired product. On the other hand, when the PSSA concentration was 0.25 M or less, the product of the polymerization was in the form of a green, clear solution which remained stable even after several days. The temperature was about 22° C.

TABLE 1

Effect of Polyacid Molarity on Aniline Polymerization

| Molar ratio PSSA: aniline | Molar ratio $NH_4S_2O_8$: aniline | Molarity of PSSA | Product |
|---|---|---|---|
| 1.0 | 0.25 | 1.63 | green insoluble gel |
| 1.0 | 0.25 | 1.00 | green insoluble gel |
| 1.0 | 0.25 | 0.50 | green insoluble gel |
| 1.0 | 0.25 | 0.25 | green clear solution |
| 1.0 | 0.25 | 0.125 | green clear solution |

EXAMPLE 2

In a second set of experiments, the initial molarity of the PSSA solution was fixed at 0.25 M and the amount of ammonium persulfate initiator was varied. As shown in Table 2 below, if the ratio of persulfate to aniline exceeded 0.25, the polymerization resulted in an insoluble gel. When the ratio of persulfate to aniline was 0.25 or less, the desired water-soluble complex was obtained. The temperature was about 22° C.

TABLE 2

Effect of Oxidizing Agent: Aniline Ratio on Aniline Polymerization

| Molar ratio PSSA: aniline | Molar ratio $NH_4S_2O_8$: aniline | Molarity of PSSA | Product |
|---|---|---|---|
| 1.0 | 0.125 | 0.25 | green clear solution |
| 1.0 | 0.25 | 0.25 | green clear solution |
| 1.0 | 0.375 | 0.25 | green insoluble gel |
| 1.0 | 0.05 | 0.25 | green insoluble gel |

The water-soluble composition of matter obtained as described in Tables 1 and 2 from the green clear solutions were precipitated in acetone, washed several times, filtered and dried to obtain a green powder. The bulk conductivity of this green powder was on the order of $10^{-2}$ to $10^{-4}$ S/cm. The powder was readily soluble in deionized water.

It is a straightforward matter to apply the composition of matter prepared in accordance with the present invention onto a substrate, for instance by spin coating a 5% aqueous solution at 2,000 rpm onto the top surface of a baked resist which is superposed on a substrate. The spin-coated layer is baked, for instance for 2 minutes at 80–90° C., to evaporate the water and leave behind a discharge layer on the order of 150 nm thickness. A discharge layer comprising a composition of matter according to the present invention, which has not been cross-linked, is removable whenever desired by water washing.

When the composition of matter described herein was used as a discharge layer on a quartz plate in the making of phase-shift masks using an electron beam resist, no charging was observed during 50 keV exposure. After development, the pattern overlay was found to be similar to that obtained when a metal based coating was used.

The compositions of matter of the present invention can be used as top surface electrical discharge layers or as buried electrical discharge layers for electron beam applications. When the compositions of matter are used as a buried discharge layer, a first resist layer is deposited onto a substrate, a layer of the composition of matter is deposited thereover, and a second resist layer is deposited onto the layer of the composition of matter. When the compositions of matter according to the present invention are used as a buried discharge layer underneath a dielectric resist layer, the top resist layer still charges up. When exposed to an electron beam the degree of charging depends upon the thickness of this top layer. If the resist material is not too thick, charge which accumulates on this top surface layer will leak to the conductive interlayer and then to ground if the conductive interlayer is arounded. It is found that the conductive interlayer does not have to be grounded to avoid a distortion of an incident electron beam. It is only necessary that the charge leak away quickly enough so as not to build up any significant potential at the electron beam target point.

The compositions of matter of the present invention have particular usefulness in electron microscony. Electron microscopy is currently used in microelectronics to make observations and dimensional measurements on dielectric masks, for example, quartzjchrome masks used in optical lithography. Charging is caused by the incident electron beam. The conventional resolution to avoid the charging problem is to deposit a thin layer of metal onto the mask. This is, however, a destructive method since complete removal of the metal layer is quite difficult if not impossible. Therefore, scanning electron microscopic observations and measurements are limited to scrap pieces. Since the compositions of matter of the present invention are readily removed, for instance by dissolution in water, they can be used as a discharge layer in scanning electron microscope application. Since the compositions of matter are removable, they can also be used as a discharge layer on the surface of masks, electronic devices such as semi-conductor chips and semi-conductor chip packaging substrates which are not scrap pieces.

Alternatively, ring-substituted polymers, such as poly (ortho-ethoxy aniline) and poly(ortho-ethyl aniline), are found to polymerize in association with polyacid in a similar manner to form the water-soluble, electrically conductive compositions of matter described herein. The resulting compositions of matter can be converted to electrically conductive, water-insoluble products upon irradiation of the composition of matter. The irradiation, which is believed to cause cross-linking of the alkyl groups on the substituents, should be carried out under conditions effective to insolublize the composition of matter. For instance, electron-beam and X-ray wavelengths are effective. Wavelengths in the ultraviolet and/or visible spectrum are also effective, provided that the compositions of matter including the polymers of the present invention have been formulated to include radical initiators such as an azide, an example of which is 4,4'-diazostilbene-2,2'-disulfonic acid disodium salt.

The preparation of crosslinkable compositions in accordance with the present invention is illustrated in the following Examples.

EXAMPLE 3

16.67 g (0.027 moles) of a 30 wt. % aqueous solution of PSSA was diluted in a flask with water to form a 5 wt. % solution. While the solution was being stirred, 3.69 g (0.027 moles) of distilled ortho-ethoxy an line was added slowly to the solution. The solution was then placed in an ice bath and cooled to about 0° C. Then, 1.55 g (0.00675 mole) of ammonium persulfate was added to the solution. The reaction mixture was allowed to warm to room temperature, where it was held for 4 hours. A green solution was formed. The resultant composition of matter was precipitated from solution by the addition of acetone to the solution. The precipitate was recovered, filtered, washed with additional acetone, and dried, whereupon a green powder was obtained. This powder could be redissolved in water to form a 10 wt. % solution.

EXAMPLE 4

Ortho-ethylaniline and PSSA were reacted in the manner described in Example 3. Again, a green powder was recovered, as a precipitate, which could be redissolved in water.

The products of Examples 3 and 4 both exhibited conductivity on the order of $10^{-3}$ S/cm.

The crosslinkable compositions of matter according to the present invention can be used to form radiation-curable and/or radiation-cured coatings on all or part of a substrate. In an advantageous alternative, crosslinkable compositions of matter as described herein can be used to form resist patterns or patterned electrically conductive, water-insoluble layers. After the layer of cross-linkable conductive, soluble material is deposited, the layer is exposed to radiation effective to cross-link the material. When the radiation is ultraviolet, visible light, or X-ray radiation, a mask is preferably interposed between the layer and the radiation source so that radiation impinges on the layer only where desired, whereby the radiation reaches the layer in a desired pattern of lines and/or shapes that are defined by the mask and/or by movement of the radiation source relative to the substrate. In the case of irradiation with electron-beam, a mask is not necessary as the beam can write directly where desired.

Upon exposure to radiation, the exposed regions of the layer become water-insoluble (though still electrically conductive) whereas the unexposed regions remain water-soluble. The unexposed regions can then be rinsed with water, thereby leaving behind a desired pattern of conductive lines. With this "negative resist" technique one can prepare conducting resists for microelectronic applications, such as patterning a dielectric or metal layer on the surface of a semiconductor chip or semiconductor chip package substrate, or forming circuit patterns.

For instance, films of the compositions of matter prepared in accordance with Examples 3 and 4 (3000 Å thick) were spun-coated onto an inert substrate and baked at 80° C. for 2 minutes and then exposed to electron beam radiation (at 200 microCoulombs/cm$^2$) in a pattern of lines. The product was then baked at 80° C. for 5 minutes, puddle-developed in water for 10 seconds and rinsed with isopropanol. A pattern of conducting lines 0.5 microns wide remained on the substrate.

The compositions of matter prepared in accordance with these examples and recovered as described therein from the clear green solution did not result in any significant loss in the quality and resolution of developed lines when tested for chemical compatibility with various conventional resist materials.

The compositions of matter of the present invention have additional uses such as an electromagnetic interference coating on a dielectric surface. For example, electrical components are frequently contained within dielectric housings such as cabinets, molded plastics and the like. To reduce the susceptibility of the electronic components contained within the housing, the dielectric housings can be coated with the composition of matter of the present invention. This electromagnetic interference technique is easily implemented in a high volume manufacturing line and has very low cost.

It is to be understood that the above described embodiments are simply illustrative of the principles of the invention, and that various other modifications and changes may be derived by those of skill in the art which will embody the principles of the invention and fall within the spirit and scope thereof.

Having thus described the invention, what we claim as new, and desire to secure by Letters Patent is:

1. A composition of matter comprising a crosslinked conjugated electrically conducive polymer, wherein said electrically conductive polymer comprises a polyacid selected from the group consisting of poly(acrylic acid), poly (methacrylic acid), poly (styrenesulfonic acid), poly (vinylsulfonic acid), poly (styrene boric acid), poly (vinyl boric acid), poly (vinyl sulfuric acid), poly (styrene phosphoric acid), poly (vinyl phosphoric acid), poly (styrene phosphonic acid) and poly (vinyl phosphonic acid), and a polymer comprising at least one conjugated region composed of repeating units which contain a conjugated basic atom, wherein said polymer is selected from the group consisting of substituted and unsubstituted homopolymers and copolymers of aniline, thiophene, pyrrole and p-phenylene sulfide, wherein the number of acid groups in said polyacid exceed the number of protonatable basic atoms in said polymer, said composition of matter being crosslinked through crosslinkable constituents on said composition of matter.

2. A composition of matter according to claim 1 wherein said crosslinked electrically conductive polymer comprises crosslinks between said polymer.

3. A composition of matter according to claim 1 wherein said crosslinkable constituents are selected from the group consisting of alkyl, alkoxy, and alkoxy alkyl.

4. A composition of matter according to claim 1 wherein said crosslinkable constituents are substituents on rings of said polymer.

5. A composition of matter comprising a crosslinked conjugated electrically conductive polymer, wherein said electrically conductive polymer comprises a polyacid, said polyacid comprises an acidic moiety selected from the group consisting of a carboxylic acid group, a phosphonic acid group, a phosphoric acid group, a boric acid group, a sulfuric acid group and a sulfonic acid group, and a polymer comprising at least one conjugated region composed of repeating units which contain a conjugated basic atom, wherein said polymer is selected from the group consisting of substituted and unsubstituted homopolymers and copolymers of aniline, thiohene, pyrrole and p-phenylene sulfide, wherein the number of acid groups in said polyacid exceed the number of protonatable basic atoms in said polymer, said composition of matter being crosslinked through crosslinkable constituents on said composition of matter.

6. A composition of matter according to claim 5, wherein said polyacid dopant is a polyacid.

7. A composition of matter according to claim 5 wherein the number of functional groups in said polyacid dopant exceeds the number of protonatable basic atoms in said polymer.

8. A composition of matter according to claim 5 wherein said crosslinkable constituents are selected from the group consisting of alkyl, alkoxy, and alkoxy alkyl.

9. A composition of matter according to claim 5 wherein said crosslinkable constituents are substituents on rings of said polymer.

10. A composition of matter according to claim 5 wherein said copolymers comprise ethylenic unsaturation.

11. A composition of matter comprising an electrically conductive polymer, wherein said electrically conductive polymer comprises a polyacid, said polyacid comprises an acidic moiety selected from the group consisting of a carboxylic acid group, a phosphopic acid group, a phosphoric acid group, a boric acid group, a sulfuric acid group and a sulfonic acid group, and a polymer comprising at least one conjugated region composed of repeating units which contain a conjugated basic atom, wherein said polymer is selected from the group consisting of substituted and unsubstituted homopolymers and copolymers of aniline, thiophene, pyrrole and p-phenylene sulfide, wherein the number of acid groups in said polyacid exceed the number of protonatable basic atoms in said polymer, said composition of matter being crosslinked through crosslinkable constituents on said composition of matter.

12. A composition of matter according to claim 11 wherein said crosslinkable constituents are selected from the group consisting of alkyl, alkoxy, and alkoxy alkyl.

13. A composition of matter according to claim 11 wherein said crosslinkable constituents are substituents on rings of said polymer.

14. A composition of matter according to claim 11 wherein said copolymers comprise ethylenic unsaturation.

15. A crosslinked composition of matter comprising a crosslinked conjugated electrically conductive polymer, wherein said electrically conductive polymer, comprises a polyacid and a polymer selected from the group consisting of substituted and unsubstituted homopolymers and copolymers of aniline, thiophene, pyrrole and p-phenylene sulfide said composition of matter being crosslinked through crosslinkable constituents on said composition of matter, wherein the number of acid groups in said polyacid exceeds the number of protonatable basic atoms in said polymer.

16. A composition of mater comprising:
   a polymer comprising at least one conjugated region composed of repeating units which contain a number of conjugated basic atom wherein said polymer is selected from the group consisting of substituted and unsubstituted homopolymers and copolymers of aniline, thiopherine, pyrrole and p-phenylene sulfide;
   a polyacid having a number of acidic groups;
   said polyacide dopes said polymer to be electrically conductive;
   said number of acidic groups exceeds said number of conjugated basic atoms wherein said polymer and said polyacid form a doped polymer further including crosslinks between said doped polymers.

17. A composition of matter according to claim 16 wherein said crosslinks are between substituents and said polymer.

18. A composition of matter comprising:
   a polymer comprising at least one conjugated region composed of repeating units which contain a number of conjugated basic atom wherein said polymer is selected from the group consisting of substituted and unsubstituted homopolymers and copolymers of aniline, thiopherine, pyrrole and p-phenylene sulfide;
   a polyacid having a number of acid groups;
   said acid groups dope said polymer to be electrically conductive;
   said number of acid groups exceeds said number of conjugated basic atoms, there being excess functional sites;
   said excess acid groups are capable of interacting with polar solvents thereby permitting said composition to be soluble in said solvents wherein said polymer comprising said ethylenically unsaturated units includes crosslinks.

19. A crosslinked composition of matter comprising an electrically conductive polymer, wherein said electrically conductive polymer comprises a polyacid, said polyacid comprising acidic moietes selected from the group consisting of carboxylic acid groups, phosphonic acid groups, phosphoric acid groups, boric acid groups, sulfuric acid groups and sulfonic acid groups, and a polymer comprising at least one conjugated region composed of repeating units which contain a conjugated basic atom, wherein said polymer is selected from the group consisting of substituted and unsubstituted homopolymers and copolymers of aniline, thiophene, pyrrole and p-phenylene sulfide, wherein the number of acid groups in said polyacid exceed the number of protonatable basic atoms in said polymer.

\* \* \* \* \*